(12) United States Patent  
Browne et al.

(10) Patent No.: US 8,550,222 B2
(45) Date of Patent: Oct. 8, 2013

(54) ACTIVE MATERIAL BASED BODIES FOR VARYING FRICTIONAL FORCE LEVELS AT THE INTERFACE BETWEEN TWO SURFACES

(75) Inventors: Alan L. Browne, Grosse Pointe, MI (US); Nancy L. Johnson, Northville, MI (US); Nilesh D. Mankame, Ann Arbor, MI (US); William Barvosa-Carter, Ventura, CA (US); Norman K. Bucknor, Troy, MI (US); Christopher P. Henry, Newbury Park, CA (US); Geoffrey P. McKnight, Los Angeles, CA (US); Guillermo A. Herrera, Winnetka, CA (US); Andrew C. Keefe, Encino, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 1306 days.

(21) Appl. No.: 11/839,713

(22) Filed: Aug. 16, 2007

(65) Prior Publication Data

US 2009/0045042 A1    Feb. 19, 2009

(51) Int. Cl.
*F16F 9/53* (2006.01)
(52) U.S. Cl.
USPC .................. 188/267.1; 188/267.2; 188/266.7; 188/381

(58) Field of Classification Search
USPC .................................... 188/267, 267.1, 267.2
See application file for complete search history.

(56) References Cited

U.S. PATENT DOCUMENTS

| 6,122,130 | A  | * | 9/2000 | Boutaghou et al. | 360/75 |
| 6,384,518 | B1 |   | 5/2002 | Van Poppel | 310/369 |
| 6,546,602 | B1 | * | 4/2003 | Eipper et al. | 24/442 |
| 6,564,916 | B1 | * | 5/2003 | Suzuki et al. | 192/21.5 |
| 6,979,050 | B2 |   | 12/2005 | Browne et al. | 296/180.5 |
| 7,118,652 | B2 |   | 10/2006 | McKnight et al. | 196/180.5 |
| 7,188,498 | B2 |   | 3/2007 | Browne et al. | 72/62 |
| 2005/0012710 | A1 | * | 1/2005 | Hayward | 345/156 |
| 2005/0198907 | A1 | * | 9/2005 | McKnight et al. | 49/475.1 |
| 2005/0206096 | A1 |   | 9/2005 | Browne et al. | |
| 2006/0056997 | A1 |   | 3/2006 | Shapiro et al. | 417/412 |
| 2006/0186700 | A1 |   | 8/2006 | Browne et al. | 96/187.01 |

* cited by examiner

*Primary Examiner* — Bradley King

(57) ABSTRACT

A device for selectively controlling and varying a frictional force level at an interface between two bodies, includes a first contact body having at least one surface, a second contact body having at least one surface in physical communication with the first contact body, and an active material in operative communication with a selected one or both of the first contact body and the second contact body, wherein the active material is configured to undergo a change in a property upon receipt of an activation signal wherein the change in a property is effective to change the frictional force level at the interface between the at least one surface of the first contact body and the at least one surface of the second contact body.

12 Claims, 9 Drawing Sheets

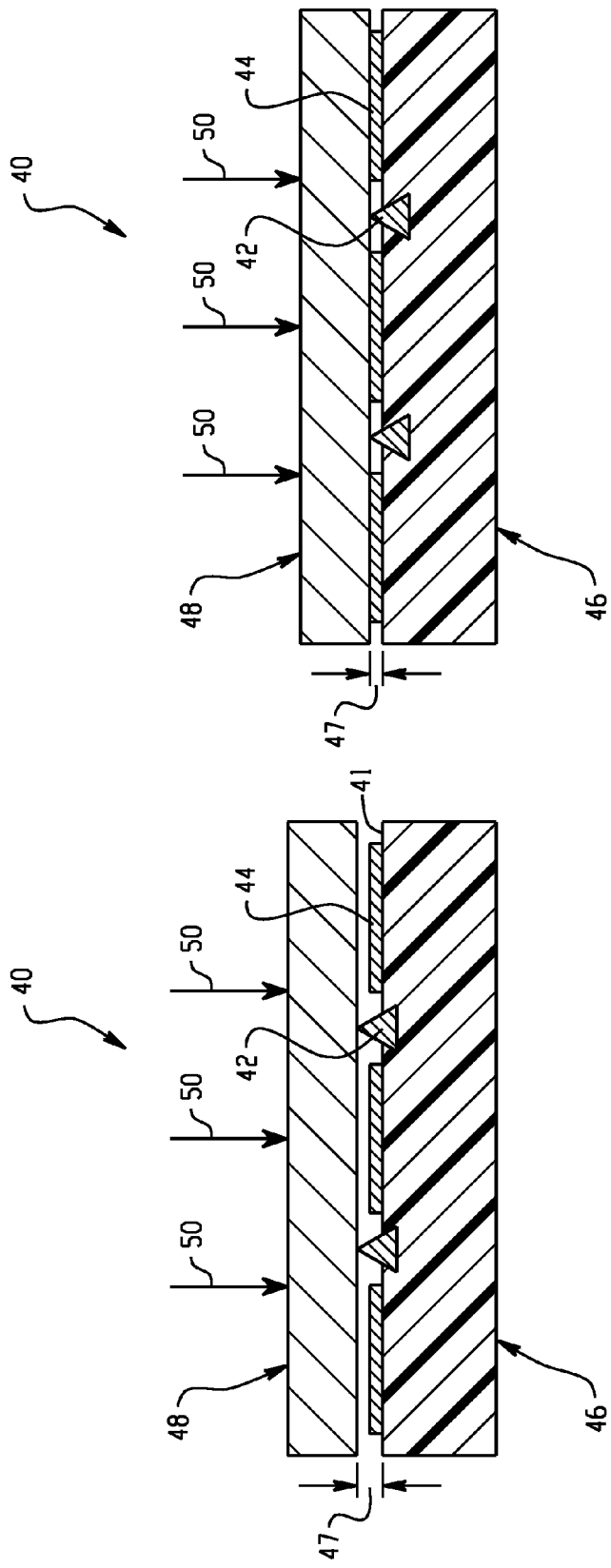

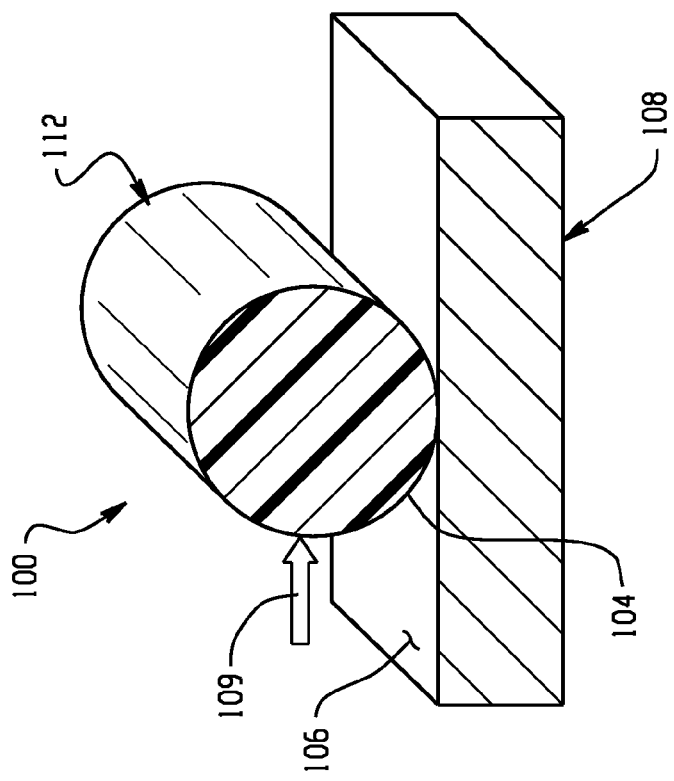
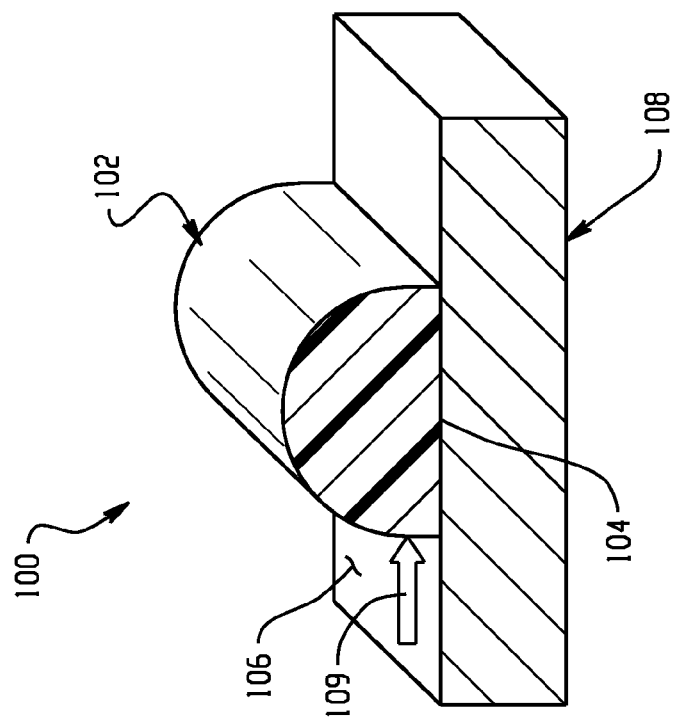
Fig. 4(b)
Fig. 4(a)

ACTIVE MATERIAL BASED BODIES FOR VARYING FRICTIONAL FORCE LEVELS AT THE INTERFACE BETWEEN TWO SURFACES

BACKGROUND

The present disclosure generally relates to methods and devices for controlling and varying frictional force levels at an interface between the surfaces of two bodies.

Several devices or processes rely on the creation or elimination of a frictional force between opposing, contacting surfaces of two bodies to perform a specific function or operation. Exemplary devices having surfaces configured to produce or eliminate a frictional force include clutches, brakes (drum brakes, disc brakes, and the like), bearings, traction drives, devices that control fluid over or between surfaces, tires, mechanical seals, clamps, and the like. Many of these devices are either unable to control the frictional force level, or control the frictional force level by adjusting the speed of, or normal force exerted by, at least one of the contacting surfaces.

Existing devices utilize actuators and motors to change relative speeds of and/or normal forces exerted by at least one of the contacting surfaces. For example, brake actuators can change a normal force between brake pads to change frictional force levels. Current devices for changing frictional force levels, however, can be expensive due to the high costs of separate actuators or motors. Further, other operational or functional requirements may not permit actuators and motors to be utilized to control frictional force levels.

Accordingly, there remains a need for improved devices and methods for controlling the frictional force at the interface of two contacting bodies.

BRIEF SUMMARY

Disclosed herein are exemplary embodiments of devices and methods for controlling a frictional force level generated between a first contact body and a second contact body. A device for selectively controlling and varying a frictional force level at an interface between two bodies, includes a first contact body having at least one surface, a second contact body having at least one surface in physical communication with the first contact body, and an active material in operative communication with a selected one or both of the first contact body and the second contact body, wherein the active material is configured to undergo a change in a property upon receipt of an activation signal, wherein the change in a property is effective to change the frictional force level at the interface between the at least one surface of the first contact body and the at least one surface of the second contact body.

A clamp includes a first contact body having a contact surface, a second contact body, disposed opposite the first contact body, having a contact surface facing the contact surface of the first contact body, wherein the combination of the first and the second contact bodies is configured to hold an object, and an active material in operative communication with a selected one or both of the first contact body and the second contact body, wherein the active material is configured to undergo a change in a property upon receipt of an activation signal, wherein the change in a property is effective to change the frictional force level between the first and second contact bodies and the object, thereby changing the force level restraining the object from relative motion with respect to the clamp.

A method for controlling a frictional force level at the interface between a first contact body and a second contact body includes, contacting a first contact surface of the first contact body and a second contact surface of the second contact body to generate a frictional force level between the first contact surface and the second contact surface, and applying an activation signal to an active material and causing a change in a property of the active material, wherein the active material is in operative communication with the first contact body and the change in a property is effective to change the frictional force level between the first contact surface and the second contact surface.

The above described and other features are exemplified by the following figures and detailed description.

BRIEF DESCRIPTION OF THE DRAWINGS

Referring now to the Figures, which are exemplary embodiments and wherein the like elements are numbered alike:

FIG. 2 is a schematic representation of an exemplary embodiment of an active material based contact body for varying frictional force levels showing the active material based contact body with two frictional elements having (a) a first frictional force level and (b) an second frictional force level;

FIG. 4 is a schematic representation of an active material based contact body for varying frictional force levels showing the active material based contact body surface with (a) a first sliding frictional coefficient and (b) a second rolling frictional coefficient;

DETAILED DESCRIPTION

Figure 1A:
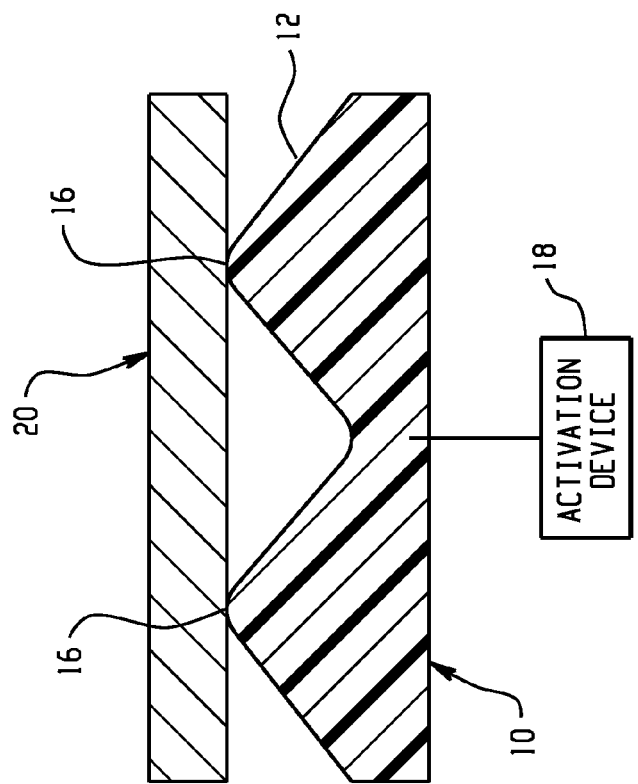
FIG. 1 is a schematic representation of an exemplary embodiment of an active material based contact body showing the active material based contact body with (a) an isotropic friction surface in physical communication with a second contact body and (b) an anisotropic friction surface in physical communication with a second contact body.

Methods and devices for varying surface texture and controlling the frictional force at interfaces between contacting bodies are described herein. In contrast to the prior art, the methods and devices disclosed herein advantageously employ active materials to modify the frictional force generated at an interface between two or more bodies. An active material component of the device allows for control of the frictional force by varying the surface morphology, the orientation, the normal force applied, and the like of the active material component through a change in a property of the active material upon receipt of an activation signal. This change can be either reversible or permanent depending on the nature of the change in the active material and/or the existence of a biasing or return mechanism. The term "active material" as used herein generally refers to a material that exhibits a change in a property such as dimension, shape, orientation, shear force, phase, elastic modulus, flexural modulus, yield strength, stiffness, and the like upon application of an activation signal. Suitable active materials include, without limitation, shape memory alloys (SMA), ferromagnetic shape memory alloys (MSMA), electroactive polymers (EAP), piezoelectric materials, magnetorheological (MR) elastomers, electrorheological (ER) elastomers, electrostrictive materials, magnetostrictive materials, and the like. Depending on the particular active material, the activation signal can take the form of, without limitation, an electric current, an electric field (voltage), a temperature change, a magnetic field, a mechanical loading or stressing (such as superelasticity in SMA), a chemical change (such as a pH change), and the like.

Also, as used herein, the terms "first", "second", and the like do not denote any order or importance, but rather are used to distinguish one element from another, and the terms "the", "a", and "an" do not denote a limitation of quantity, but rather denote the presence of at least one of the referenced item. Furthermore, all ranges directed to the same quantity of a given component or measurement is inclusive of the endpoints and independently combinable.

A device for selectively controlling and varying a frictional force level at an interface between two bodies, includes a first contact body having at least one surface, a second contact body having at least one surface in physical communication with the first contact body, and an active material in operative communication with a selected one or both of the first contact body and the second contact body, wherein the active material is configured to undergo a change in a property upon receipt of an activation signal, wherein the change in a property is effective to change the frictional force level at the interface between the at least one surface of the first contact body and the at least one surface of the second contact body.

The devices for selectively controlling and varying frictional force levels at an interface between two bodies as disclosed herein may be used in any application adversely or beneficially affected by friction, such as traction devices, clutches, brakes, bearings, clamps, and the like. As an example, in one embodiment, one or more active material based bodies are used to modify journal bearing performance. The interface profile between the journal and bearing can be reversibly adjustable by using active materials to change the radial clearance between the journal housing and the bearing. When the radial clearance between the journal and the bearing has decreased below a minimum threshold, such that the lubricant thickness is too low and the bearing produces undesirable levels of heat, for instance, the clearance can be increased by changing the respective interfacial profiles of the journal and or the bearing. Conversely, if the radial clearance is too great, such that the bearing produces undesirable noise levels, the clearance can be decreased by changing the respective interfacial profiles of the journal and or the bearing. In another example, the active material based bodies can be employed to control flow rate, volume, and the like of a fluid or gas between two surfaces.

These are just some of the many examples where the ability to adjust the frictional forces and/or vary the texture of a surface would be advantageous. Other applications, which could advantageously make use of the active material based body embodiments and methods disclosed below, will be known to those skilled in the art, and can include without limitation, controlling the amount of slip in a variable speed drive, acting as a clutch at an interface, engaging/disengaging dial knobs, increasing traction on slippery surfaces, for example texturing a shoe bottom when walking on ice, texturing a tire surface on demand, texturing a seat belt or seat surface to increase sliding friction, texturing grips on tools, sports gear, and the like to improve grip, decreasing texture to eliminate mechanical interlock (i.e., reduce traction to zero) between surfaces to allow relative movement such as in disassembly, increasing texture relative to tire wear to maintain a constant traction level, and other like applications. In addition, it is to be understood that the surface texture and/or frictional force levels of the surface is controlled by active materials in communication with the body having the surface. Moreover, while certain methods were described with reference to specific active materials, it is to be understood that any active material may be capable of use for a certain application and method and may depend on the physical characteristics of the materials. The active materials may also take any physical form, such as, for example, porous, solid, embedded in second material (randomly or oriented), laminate, lattice, particles, fibers, and the like.

The active material may change at least one property in response to an activation signal, and revert back to the original state of the at least one property upon discontinuation of the activation signal, or, for the classes of active materials that do not automatically revert upon discontinuation of the activation signal, alternative means can be employed to revert the active materials to their original state. In this manner, the active material based bodies function to adjust to changing conditions while increasing device simplicity and reducing the number of failure modes.

The activation of the active materials can also be configured to vary with time. Moreover, the time-varying activation can occur continuously, wherein the active material changes property with the time variation of the activation signal, as opposed to non-varying activation wherein the active material changes property between two discrete states at activation. The above-listed suitable active materials for use in the active material based bodies will be discussed in greater detail below.

Coupled to and in operative communication with the active material based body is an activation device, which can be linked to a control system. The activation device is operable to selectively provide an activation signal to the active material based body(ies) and change the frictional force level between two bodies in contact by changing at least one property of the active material(s). The activation device can be configured to control the nature of the change in the at least one property of the active material, and, therefore, the change in the frictional force level at the interface between two surfaces of the bodies. Examples of the controllable nature of the change include, without limitation, a change in shape, a change in orientation, a change in compliance characteristics, a change in the normal force applied, and like changes of the active material based body. For example, the active material can change at least one property, for example, during the application of a brake or engagement of a clutch. The activation device, on demand, provides the activation signal or stimulus to the active material of the active material based body to cause the change in a feature, such as but not limited to, frictional force of at least a portion of the surface of the body. In one embodiment, the change in feature generally remains for the duration of the applied activation signal. Upon discontinuation of the activation signal, the active material generally reverts to a deactivated form and returns substantially to the original at least one property, thus reverting the active material based body, and therefore the friction force level, to the original interfacial force level. In another embodiment, the change in at least one property of the active material and/or feature of at least a portion of the active material based body may remain upon discontinuing the activation signal. The embodiments described below are exemplary only and are not intended to be limited to any particular shape, size, dimension or configuration, material, or the like.

Alternatively, the activation signal can be applied to the active material passively, rather than through the use of an activation device. In this manner, the activation signal can be provided by the environment in which the active material based body is disposed. A change in at least one property of the active material can, therefore, be passively activated. As a first example, in the case of ferromagnetic SMA or magnetostrictive materials in general, exposure to a magnetic field will cause dimensional changes in these active materials that if suitably arranged or configured will result in either the increase or decrease in frictional force at the interface with a second body. As a second example, a sealing cap on a liquid container, such as a gas can, when exposed to high temperature, expands thereby releasing the seal of the cap to the can and allowing the excess pressure to escape. In another example, an active material based body can be used in a clutch application, where the active material can be passively activated when the environmental temperature exceeds a predetermined level. The activated active material could then increase the texture of the body, thereby engaging the clutch of a ventilation/circulation fan/propeller to cool down a system such as an automotive engine.

Several embodiments of the active material based devices and methods for varying frictional characteristics of a body and, therefore, the interfacial force levels between that body and second body, are disclosed below. In each of the figures, the particular embodiment is shown with the active material component in both an (a) activated state and (b) a deactivated state for ease in discussion and understanding of the function of the particular application. Moreover, it is to be understood that a selected one or more of the bodies in contact may comprise active materials.

Referring now to FIG. 1, an exemplary active material based first contact body 10 having an adjustable surface morphology is illustrated. The first body 10 has a contact surface 12 comprising an active material. A second contact body 20, which may or may not comprise active material, is in physical communication with the active material based contact body 10 and a first frictional force level exists at the interface 16 between the contact surface 12 and the second body 20. FIG. 1 illustrates how the change in surface morphology of the active material based contact body 10 affects the second contact body 20. When the active material in the contact surface 12 is in a deactivated state, as shown in FIG. 1(a), the contact area between the active material based contact body 10 and the second contact body 20 is maximized and a first frictional force exists. When the active material is activated, the shape of the contact surface 12 changes, e.g. wrinkles, thereby significantly changing the surface morphology of the first contact body 10 and reducing the contact area with the second contact body 20, as shown in FIG. 2(b). The reduction in contact area creates a second frictional force level at the interface of the first contact body 10 and the second contact body 20.

Figure 1B:
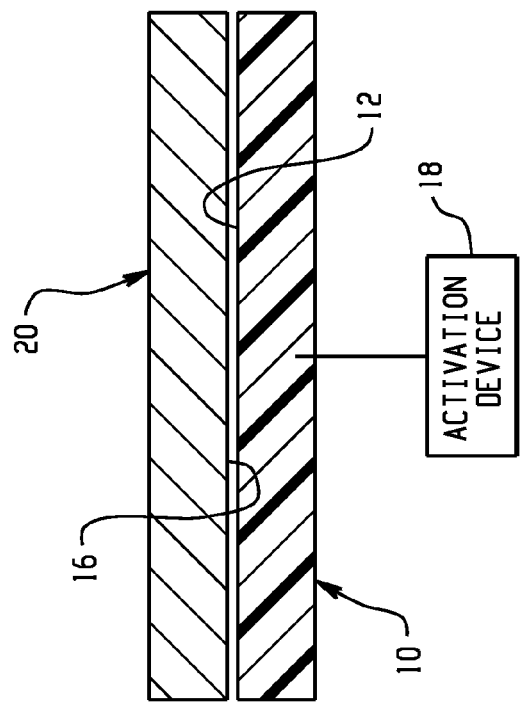

Further, by changing shape, the contact surface 12 transitions from an isotropic frictional surface (FIG. 1(a)) to an anisotropic frictional surface (FIG. 1(b)). When deactivated, the first contact body 10 has an isotropic friction surface with a coefficient of friction that is substantially the same regardless of the direction that the first contact body 10 moves relative to the second contact body 20. When in an activated state, the first contact body 10 has an anisotropic friction surface with coefficients of friction that vary based on the direction that the contact body 10 moves relative to the second contact body 20. For example, when contact body 10 is activated and the contact surface 12 changes shape, the contact body 10 and second contact body 20 have a first coefficient of friction when the second body moves parallel to the general direction the elevated "wrinkles" extend, and have a second coefficient of friction when the second contact body moves perpendicular to the general direction the "wrinkles" extend.

In an exemplary embodiment, the active material based first contact body 10 can change the frictional force levels between itself and the second contact body 20 when the active material is activated upon receipt of an activation signal. In the embodiments disclosed herein, the activation signals may be active or passive. As shown in FIG. 1, an activation device 18 provides the activation signal to the active material based first contact body 10. The activation signal provided by the activation device 18 may include a heat signal, a magnetic signal, an electrical signal, a pneumatic signal, a mechanical signal, a chemical signal, and the like, and combinations comprising at least one of the foregoing signals, with the particular activation signal dependent on the materials and/or configuration of the active material. For instance, a heat signal may be applied for changing the property of the active material fabricated from SMA and/or SMP. An electrical signal may be applied for changing the property of the active material fabricated from EAP, piezoelectrics, electrostrictives, and/or electronic EAP's. A magnetic field may be applied (removed, or changed) for changing the property of the active material fabricated from magnetostrictive materials such as MSMA, Terfenol D, Galfenol, and MR elastomers.

Turning now to FIG. 2, another exemplary embodiment of an active material based contact body 40 is illustrated. The contact body 40 functions in a manner similar to that of first contact body 10 described above, except in this embodiment the contact surface 41 comprises two frictional elements 42 and 44. The contact body 40 comprises an active material layer 46, wherein the first friction element 42 is disposed within the active material layer 46 and protrudes through the contact surface 42, while the second friction element 44 is disposed on the contact surface 41 of the layer. The active material layer 46 is configured to undergo a change in at least one property upon receipt of an activation signal. For example, when the active material layer 46 comprises an SMP, the SMP may transition from a first stiffness level to a second stiffness level when a thermal activation signal heats the SMP above the glass transition temperature. When the SMP layer 46 has the first stiffness level, the first friction elements 42 protrude from the surface of the SMP layer 46, such that only the first friction elements 42 are in physical communication with a second contact body 48, as shown in FIG. 2(a). When a normal force 50 is applied to the second contact body 48, a first frictional force level is created at the interface 47 between the first contact body 40 and the second contact body 48. When the SMP layer 46 is activated and has the second stiffness level, the first friction elements 42 recede into the softer SMP layer 42 when under the normal force 50. This effect may be enhanced by only softening the areas supporting the first frictional element, 42. As a result, the second friction elements 44 also become in physical communication with the second contact body 48, thereby creating a second frictional force level at the interface 47, as shown in FIG. 2(b). The active material based contact body 40 is, therefore, capable of selecting between two frictional elements providing two different frictional force levels, based upon the thermal signal applied the SMP, as well as the normal forces being applied to one or both of the bodies in contact. In the case of a SMP, it may be necessary to remove the normal load 50 to reset the initial frictional coefficient.

Figure 3A:
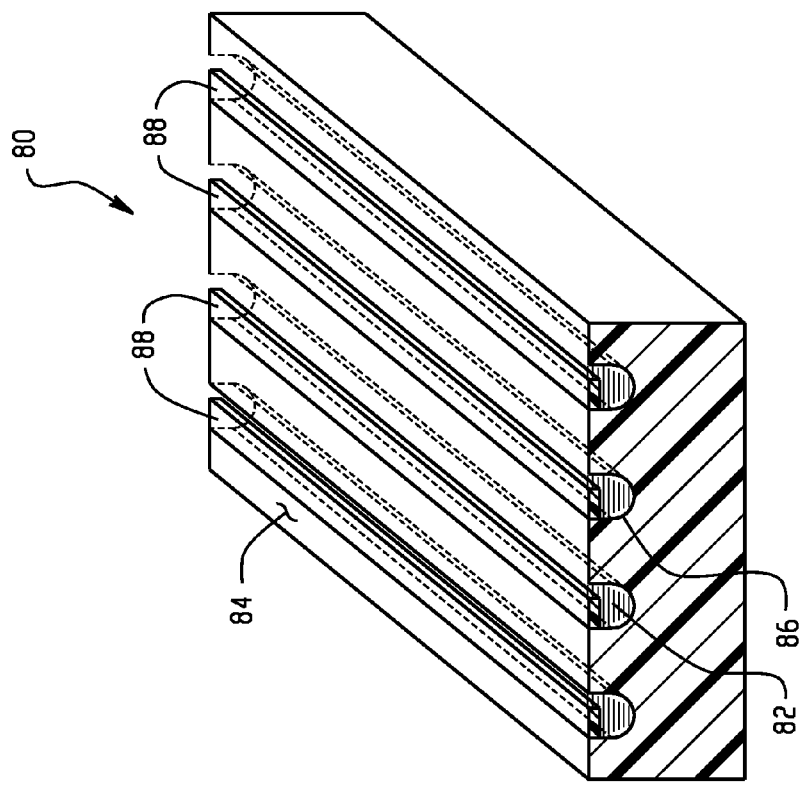
FIG. 3 is a schematic representation of an exemplary embodiment of an active material based contact body for varying frictional force levels through the control of fluid flow, showing the active material based contact body surface in (a) a first position and (b) a second position.

In FIG. 3, another exemplary embodiment of an active material based contact body 80 is illustrated. The contact body 80 can control frictional force levels by changing an amount, a location, or a flow path of a fluid 82 disposed on a contact surface 84 of the contact body 80. By controlling the fluid 82 the contact body 80 can control frictional force levels between the contact surface 84 and the contact surface of a second contact body (not shown).

The fluid 82 is embedded within the contact body 80. In this embodiment, the fluid is disposed just below the surface 84 in channels 86. The sub-surface channels 86 extend through the contact body 80 as indicated by the dashed lines in FIG. 3. The contact body 80 further comprises active material portions 88 disposed in the surface 84 directly above the channels 86. The active material portions 88 are configured to transition between a first position (shown in FIG. 3(a)) and a second position (shown in FIG. 3(b)) through a change in at least one property of the active material upon receipt of an activation signal. When the active material portions 88 are in the first position, the channels 86 are completely encapsulated beneath the surface 84, such that no fluid 82 is permitted to reach the surface of the contact body 80. When the active material of active material portions 88 undergo a shape change upon receipt of an activation signal, the portions 88 transition to the second position such that the active material portions 88 are retracted, thereby allowing the fluid 82 of the channels 86 to be in fluid communication with the surface 84. When the active material portions 88 are in the second position, the fluid 82 is permitted to travel from the channels 86 to the surface 84, thereby changing the frictional force between the contact body 80 and a second contact body.

For example, in one embodiment, the active material portions 88 can comprise an SMA. Upon receipt of a thermal activation signal, the SMA portions are configured to contract in a length dimension—from the first position (FIG. 3(a)) to the second position (FIG. 3(b)). When it is desired, the thermal activation signal can be deactivated and a biasing mechanism (not shown) can be used to return the SMA portions from the second position back to the first position, thereby sealing the remaining amount of fluid 82 in the channels 86.

The fluid 82 can be any fluid, which would change the frictional force levels between two bodies from the frictional force levels that exist at the interface when no fluid is present. For example, the fluid 82 may be a lubricating fluid configured to lower a coefficient of friction between the surface 84 and the contact surface of a second body. Alternatively, the fluid 82 could be an anti-lubricant, such as a sand-fluid solution, that increases the coefficient of friction between the surface 84 and that of the second body.

Figure 3B:
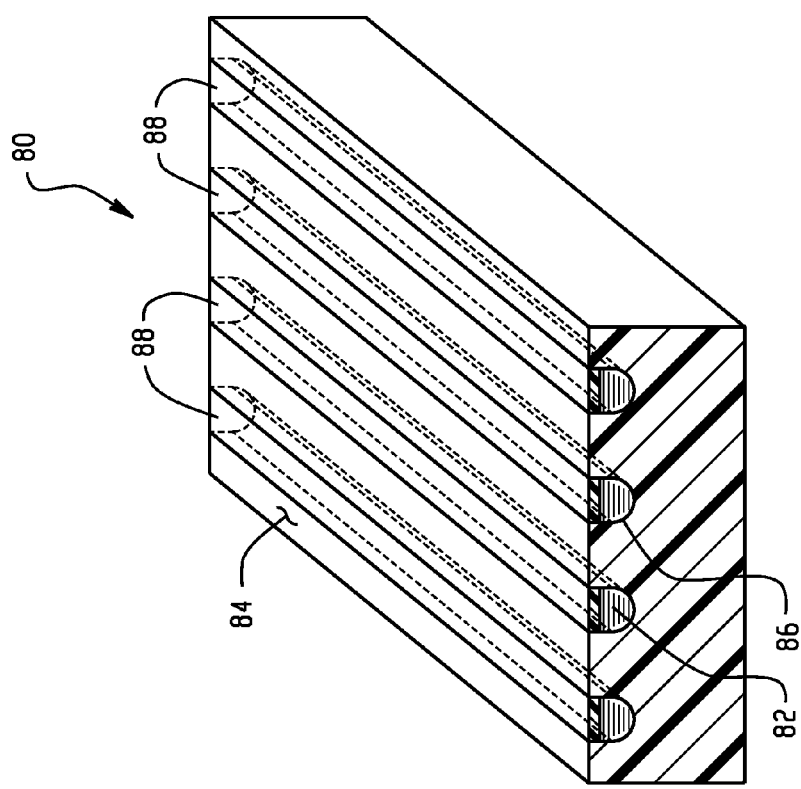

In an alternative embodiment, the contact body 80 could comprise a surface 84 fixed in the second position, as shown in FIG. 3(b). In this embodiment, rather than having active material portions on the surface 84, the channels 86 could be formed of active material. In a deactivated state the channels 86 could have a first depth. Upon receipt of an activation signal, the channels 86 could change shape such that the channels 86 have a shallower second depth. At this activated shallower second depth, the fluid 82 would be injected onto the surface 82, thereby changing the frictional force levels between the surface 84 of the contact body 80 and the corresponding surface of a second body. To reiterate, the embodiments of the contact body as shown in FIG. 3 advantageously uses active materials to permit and/or restrict the flow of a liquid at the interface between two bodies.

Referring now to FIG. 4, an active material based contact body 100 is shown. The contact body 100 comprises an active material and can control the frictional force level between itself and another contact body by changing shape. The contact body 100 has a first shape 102 with a first contact surface 104, as shown in FIG. 4(a). The first surface 104 is essentially flat and is in physical communication with a second contact surface 106 of a second contact body 108. When the contact body 100 has the first shape 102, a sliding kinetic frictional coefficient exists between the contact body 100 and the second body 108, such that the contact body 100 will slide along the second contact surface 106 when a force 109 is applied.

Upon receipt of an activation signal, the active material of the contact body 100 undergoes a change in at least one property, i.e., a shape change. The shape change results in the contact body 100 having a second shape 112 when activated, as shown in FIG. 4(b). In the second shape 112, the first contact surface 104 is curved such that a rolling frictional coefficient exists between the contact body 100 and the second body 108. When the same force 109 is applied, the contact body 100 rolls along the second contact surface 106, as opposed to sliding when the active material is deactivated and the contact body 100 has the first shape 102. The active material based contact body 100, therefore, can transition between a first shape and a second shape upon receipt of an activation signal to change the frictional coefficient between itself and another contact body. For example, the active material of the contact body 100 can be a shape memory material, such as an SMP, which can have a trained shape when heated to certain temperatures as will be explained in greater detail below.

In an alternative embodiment, the active material based contact body 100 may change the frictional coefficient between itself and another contact body by changing the orientation of the first contact surface 104, rather than changing the shape of the surface. In this embodiment, the active material may be configured to change shape, which would result in the reorientation of the contact body 100 upon receipt of an activation signal. For example, instead of changing from the first shape to the second shape as shown in FIG. 4, the contact body 100 could rotate such that the flat first contact surface 104 is rotated away from the second contact body 108 and the curved portion 105 of the contact body 100 becomes in physical communication with the second contact surface 106.

Figure 5A:
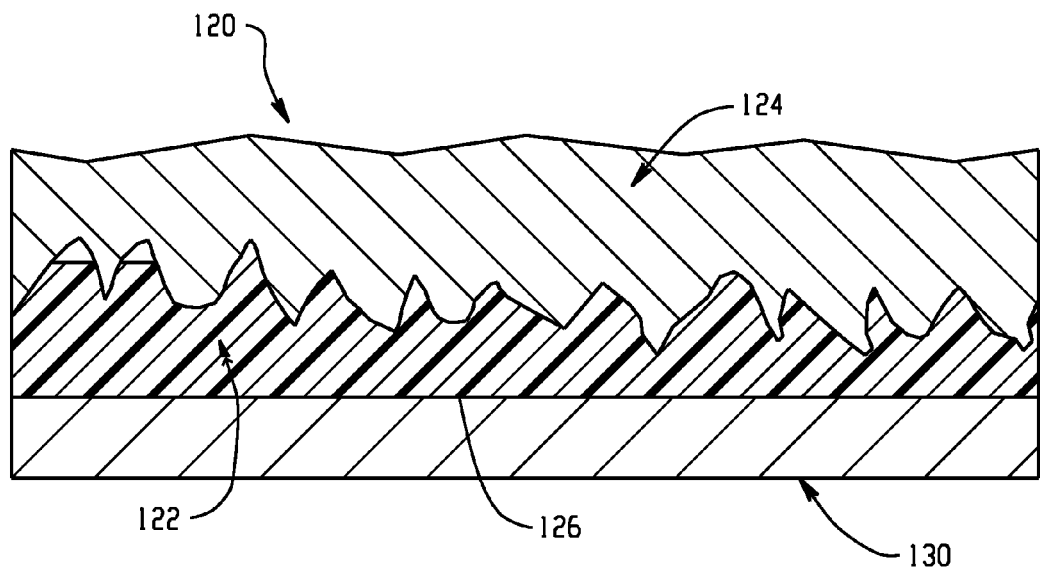
FIG. 5 is a schematic representation of an active material based contact body for varying frictional force levels showing the active material based contact body with two layers having (a) one surface a first frictional coefficient and (b) another surface with a second frictional coefficient.
Figure 5B:
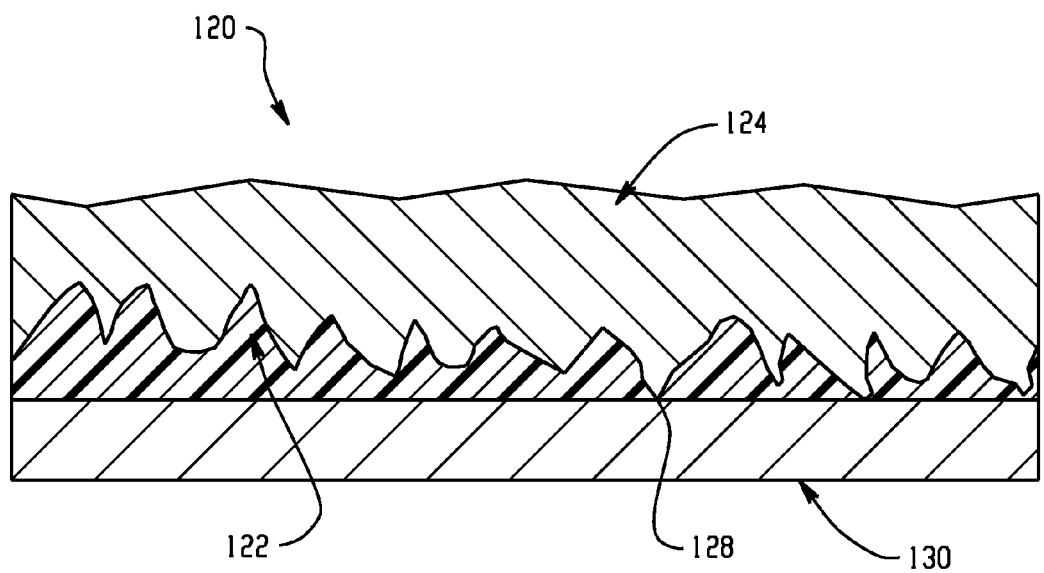

In FIG. 5, a contact body 120 is illustrated. The contact body 120 is configured to change frictional force levels through the use of active and/or phase changing materials. As used herein the term phase changing materials refers, but is not intended to be limited to, a material which undergoes a phase change in response to a change in environmental conditions, such as, for example, wax, ice, baroplastics, thermoplastics, and the like. The contact body 120 may comprise an active material and/or a phase changing material and is configured to undergo a transition from a first hardness to a second hardness upon receipt of an activation signal or exposure to changes in environmental conditions. FIG. 5 depicts the contact body 120 having an active (or phase change) material layer 122 and a hard material layer 124 disposed on top of the active material layer 122.

When the contact body 120 has the first hardness, as shown in FIG. 5(*a*), the active material layer 122 has a first hardness level sufficient to provide the contact body 120 with a contact surface 126 having a first frictional coefficient. In other words, the contact surface 126 comprises the surface of the active material layer 122, as shown in FIG. 5(*a*), and a first frictional force level exists at the interface between the contact surface 126 and the second contact body 130. When the active material layer 122 is exposed to an activation signal, the active material softens (or in the case of a phase change material, changes phase) resulting in the second hardness level. The hard material layer 124 is able to plastically deform the active material layer 122, thereby protruding through the active material layer to form a contact surface 128 having a second frictional coefficient. In other words, the contact surface 126 comprises the surface of the hard material layer 124, as shown in FIG. 5(*b*), and a second frictional force level exists at the interface between the contact surface 128 and the second contact body 130. The contact body 120, therefore, is able to selectively change the frictional forces between itself and a second contact body 130 by changing the hardness of the active material layer 122 and allowing the hard material layer 124 to deform the active material upon receipt of an activation signal.

Figure 6A:
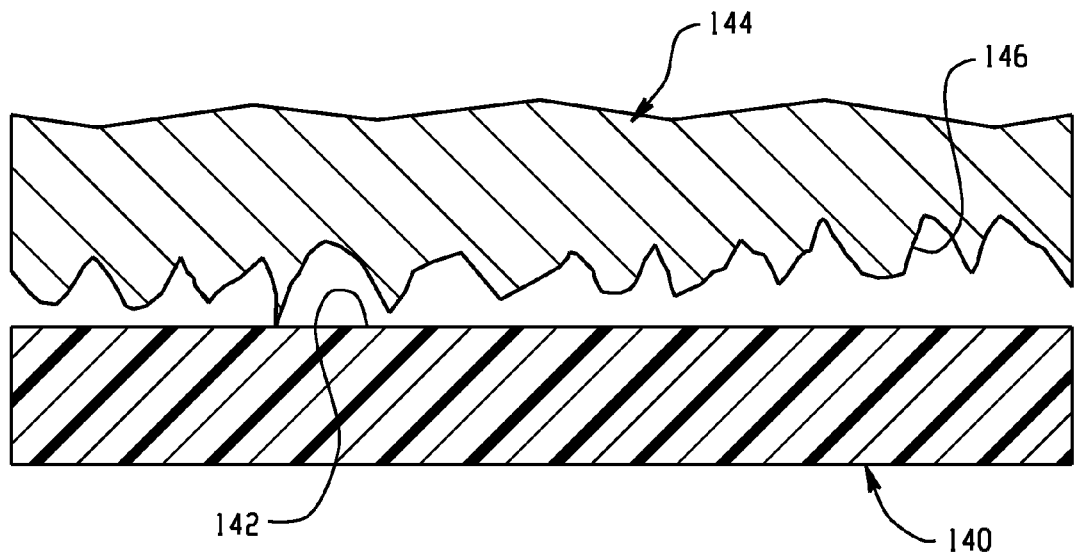
FIG. 6 is a schematic representation of another active material based contact body for varying frictional force levels showing the active material based contact body surface with (a) a first frictional coefficient and (b) a second frictional coefficient.
Figure 6B:
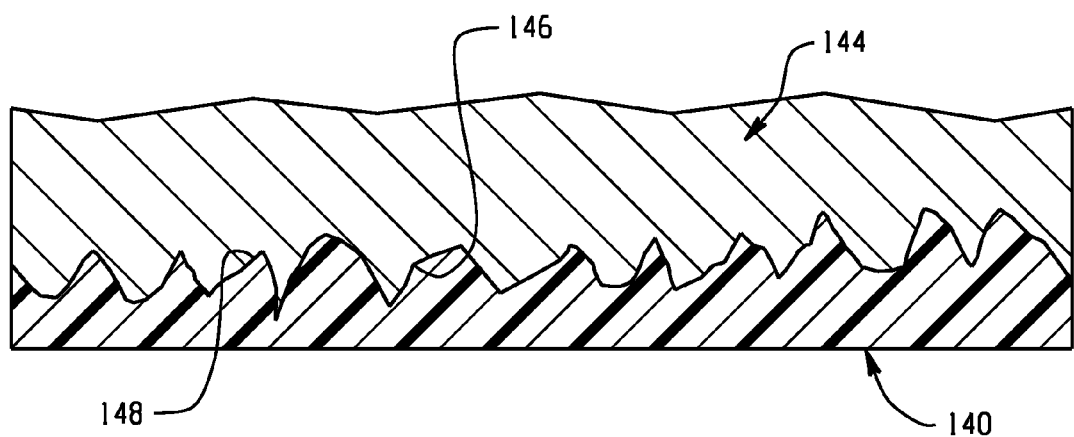

Turning now to FIG. 6, another exemplary embodiment of an active material based contact body 140 is illustrated. The contact body 140 comprises an active material and is configured to control frictional force levels through the change in a property, i.e. hardness, of the active material upon receipt of an activation signal. The contact body 140 has a first contact surface 142 and transitions between a first hardness level and a second hardness level in response to an activation signal. A second contact body 144 comprises a solid material and has a second contact surface 146, which has a rough texture relative to the first contact surface 142. When the contact body 140 has the first hardness level, as shown in FIG. 6(*a*), the active material has hardness sufficient to support the second contact body 144 on the first contact surface 142, thereby providing a first frictional force level at the interface between the two contacting bodies. When the contact body 140 has the second hardness level, as shown in FIG. 6(*b*), the active material softens and the second contact body 144 is able to elastically and/or plastically deform the contact body 140, thereby shaping a first contact surface 148 and providing a second frictional force level at the interface between the two contacting bodies.

Figure 7A:
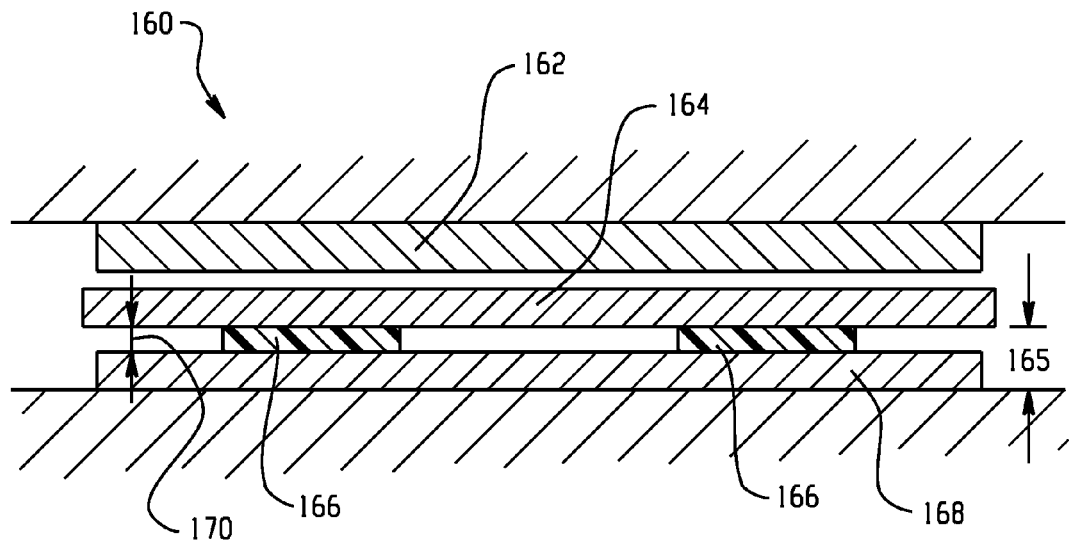
FIG. 7 is a schematic representation of an active material based contact body for varying frictional force levels showing the active material based contact body applying (a) a first normal force to a second contact body (as low as zero as shown in the depiction in FIGS. 7a) and (b) a second normal force to the second contact body.
Figure 7B:
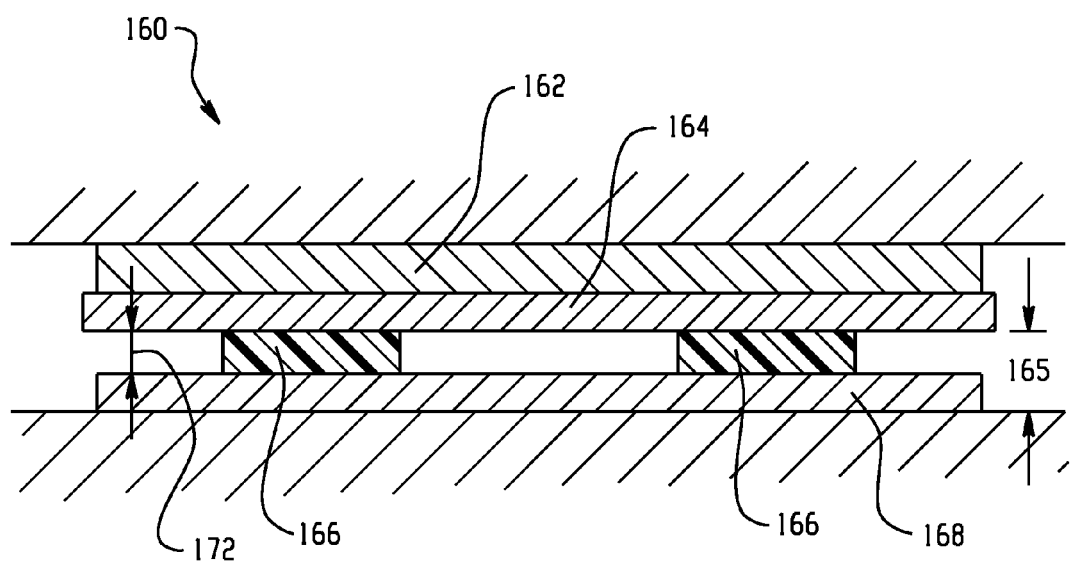

In FIG. 7, yet another exemplary embodiment of an active material based contact body 160 is shown. The contact body 160 is configured to control frictional force levels by changing a normal force level between itself and a second contact body 162. The contact body 160 comprises a first contact portion 164 and a second portion 165 comprising active material components 166 and a base portion 168. The active material component 166 may be comprised of any suitable active material, such as piezoelectric material or shape memory alloy material. The active material components are configured to undergo a change in a property, such as, a shape change, upon exposure to an activation signal, such as an electrical current. The active material components 166 transition between a first shape having a first thickness 170, as shown in FIG. 7(*a*), and a second shape having a second thickness 172, as shown in FIG. 7(*b*).

When the active material components 166 have the first thickness 170, the first contact member 164 is configured to contact the second contact body 162 with a first normal force (zero in the depiction in FIG. 7*a*). When the active material components 166 have the second thickness 172, the first contact portion 164 is configured to contact the second contact body 162 with a second normal force. By changing the normal force between the two contact bodies, the frictional force at the interface between the two bodies is changed without changing the frictional coefficient therebetween. In this particular embodiment, the active material components 166 essentially provide a variable clamping force when the contact body 160 is in physical communication with a second contact body.

Figure 8A:
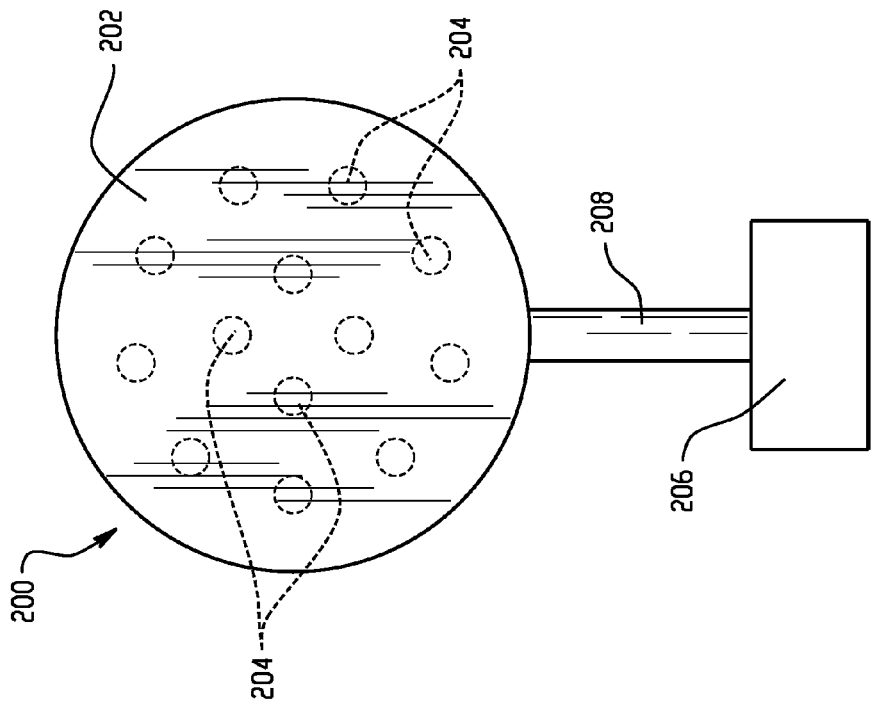
FIG. 8 is a schematic representation of an active material based contact body for varying frictional force levels showing the active material based contact body with (a) a first contact surface (with open apertures or holes or other form of openings) and (b) a second contact surface (with closed apertures, holes, etc.)
Figure 8B:
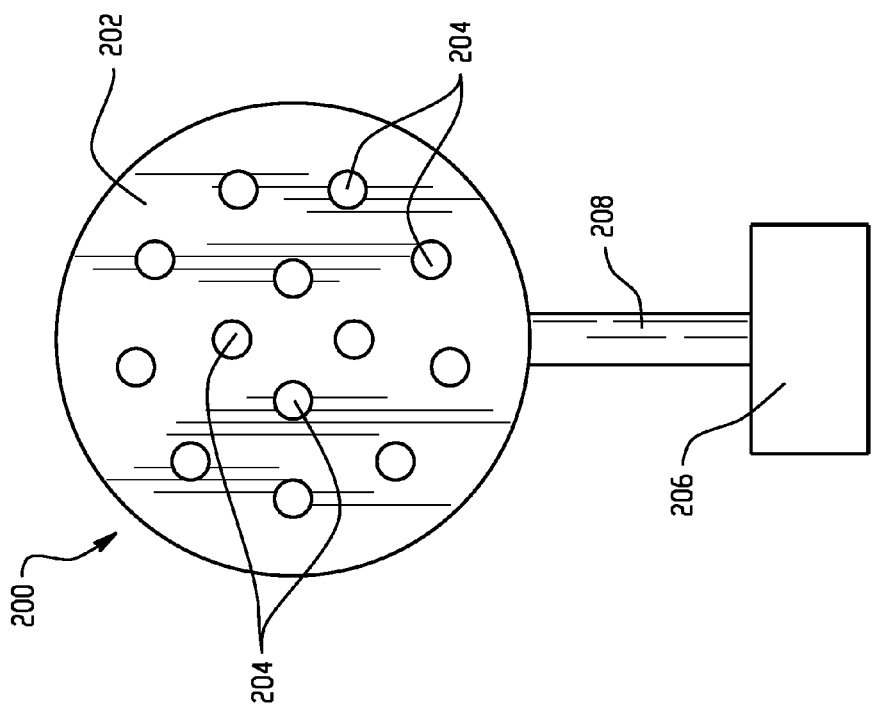

Referring now to FIG. 8, another active material based contact body 200 is illustrated. The contact body 200 is able to control frictional force levels by changing a normal force between itself and a second contact body. In this particular embodiment, the contact body 200 is a vacuum chuck, which controls frictional force levels by controlling air pressure levels between itself and a second contact body. In another embodiment, the contact body 200 may be a fluid bearing structure. The vacuum chuck 200 comprises a contact surface 202, which has apertures 204 disposed thereon. A power source, in this case a vacuum pump 206, is in operative communication with the vacuum chuck 200 via a conduit 208. The conduit 208 fluidly connects the vacuum pump 206 to the vacuum chuck 200.

The contact surface 202 of the vacuum chuck 200 comprises an active material. The active material of the contact surface is configured to transition between a first position and a second position through a change in a property of the active material upon receipt of an activation signal. When the active material is in the first position, as shown in FIG. 8(*a*), the contact surface 202 has the apertures 204. When the active material is in the second position, as shown in FIG. 8(*b*), the active material covers the apertures 204, such that the contact surface 202 is a solid uniform plane. The active material of the vacuum chuck 200 permits variably selecting the amount of fluid communication between the contact surface 202 and a second contact body. In other words, the active material is configured to control the amount of vacuum supplied to the vacuum chuck 200 by the vacuum pump 206. The amount of vacuum at the contact surface 202 controls the frictional force level at the interface between the chuck surface 202 and a second contact body. When the active material is in the first position, the chuck and the second body have a first normal force between them. When the active material is in the second position, the chuck and the second body have a second normal force between them. Furthermore, the active material of the vacuum chuck 200 can be configured to permit vacuum through certain apertures while covering others. For example, an activation device can be used to selectively supply electricity to resistance heaters at selected portions of the contact surface 202 to open selected apertures 204, while not supplying electricity to those resistance heaters surrounding the other apertures, such that they remain closed. When operated in this manner, the vacuum chuck 200 is able to selectively apply more than two normal force levels to a second contact body.

As mentioned above, in another exemplary embodiment, the contact body 200 can function as a fluid bearing type structure, wherein a compressor, the power source in this circumstance, can supply positive pressure through the apertures 204, thereby providing repulsive forces between the two contact bodies. Furthermore, active materials may be disposed in other locations in the contact body 200 to control fluid flow. For example, a valve comprising an active material may be disposed in the conduit 208, where the valve is configured to allow different levels of fluid flow through the conduit 208 in response to different activation signals. In yet another embodiment, the vacuum pump 206 may comprise active material components. For example, the pump 206 may comprise a piezoelectric material, wherein a change in the shape of the piezoelectric material in response to an electric current is configured to pump fluid.

Figure 9:
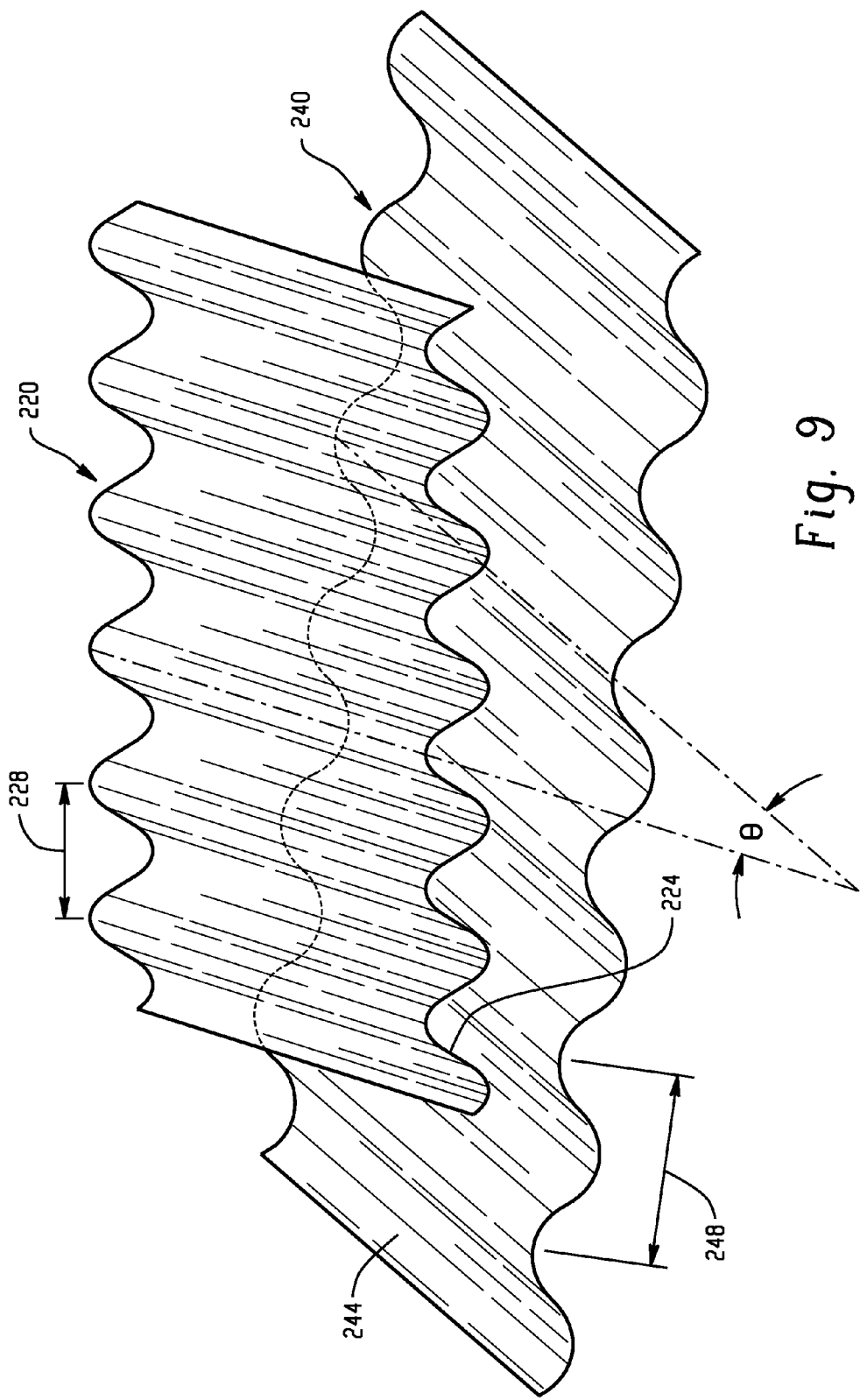
FIG. 9 is a schematic representation of an active material based contact body for varying frictional force levels showing the active material based contact body with in a position with an orientation angle, theta, relative to the position of a second contact body.

Turning now to FIG. 9, another embodiment of an active material based contact body 220 is illustrated. In this embodiment, the contact body 220 can change a frictional force level between itself and a second contact body 240, by changing the orientation of the first contact body 220 relative to the second contact body 240. The contact body 220 has a first contact surface 224 and is comprised of an active material. The active material, for example an SMP, is configured to change the orientation of the first contact surface 224 relative to a second contact surface 244 of the second contact body 240. Upon receipt of an activation signal, the active material of the first contact body 220 undergoes a change in a property, e.g. a shape change, which results in a reorientation of the first contact surface 224 relative to the second contact surface 244. Such a reorientation, which is represented in FIG. 9 as an angle of θ, relative to when the two bodies are in parallel over one another, i.e., when the wave shapes are parallel, greatly affects the interfacial friction between the two contact bodies, particularly when the two contact surfaces have anisotropic textures. For example, the first and second contact surfaces 224, 244 can have corresponding wave shapes. When the active material of the first contact body 220 is in a first position and deactivated, a first frictional force exists between the two contact surfaces. When the active material is activated, however, the first contact body 220 transitions to a second position in response to the change in the property of the active material, and as a result, a second, higher frictional force exists between the two bodies due to the anisotropic nature of the respective surfaces. In this particular embodiment, for example, friction levels for forces axially perpendicular to the waves, can vary from a highest coefficient of friction when waves 228 of the first contact body 220 are parallel to waves 248 of the second contact body 240, to a lowest coefficient of friction when the waves 228 of the first contact body 220 reorient angularly to the waves 248 of the second contact body 240 (as shown in FIG. 9).

Moreover, the interfacial frictional force between the two contact bodies may be further changed with changes in the surface texture of the first and/or second contact body 220, 240. As described in similar methods above, the first and/or second contact surfaces 224, 244 may change texture, e.g. shape, to affect the interfacial friction. The interfacial frictional force can be changed by reversibly adjusting the wavelength and/or the amplitude of the waves 228, 248 of the respective wave-shaped contact surfaces. Furthermore, in other exemplary embodiments, the active material of the first contact body 220 may change the orientation relative to the second contact body 240 such that different portions of the first contact surface 224 contact different portions of the second contact surface 244. For example, the reorientation of the first contact body 220 may cause a portion of the first contact surface 224 having a surface texture different than that of the portion previously touching the second contact surface 244 to come into contact with the second body, thereby changing the frictional force level.

In one specific area of application, which is not meant to limit the use of the devices described herein, they can be advantageously employed as an active material based clamp. A clamp, or other similar clamping tools such as, without limitation, a vice, vice grips, pliers, and the like, can employ the use of active material(s) to vary the clamping force of an object disposed between the first and second contact bodies through activation of the active material(s). In one exemplary embodiment, a clamp can include a first contact body, having a contact surface, a second contact body, disposed opposite the first contact body, having a contact surface facing the contact surface of the first contact body, wherein the combination of the first and the second contact bodies is configured to hold an object, such as the device shown in FIG. 1. An active material can be in operative communication with a selected one or both of the first contact body and the second contact body, wherein the active material is configured to undergo a change in a property upon receipt of an activation signal. The change in a property is effective to change the frictional force level between the first and second contact bodies and the object (not shown), thereby changing a clamping force on the object. The active material based clamp can, therefore, selectively improve grip on an object by improving the frictional force between its contact bodies and the object. Moreover, for embodiments where changes in surface texture of the contact bodies vary the frictional force, the clamp can be configured to have no texture (i.e. a smooth surface) when holding a soft object or an object that is sensitive or easily breakable. When it is desired to hold a sturdier object, such as a pipe for example, the surface texture can be increased to form a rough texture that is more useful for securing hard objects.

As previously mentioned, suitable active materials for the above described contact bodies that can vary interfacial frictional force levels between surfaces include, without limitation, shape memory alloys ("SMAs"; e.g., thermal and stress activated shape memory alloys and magnetic shape memory alloys (MSMA)), electroactive polymers (EAPs) such as dielectric elastomers, ionic polymer metal composites (IPMC), piezoelectric materials (e.g., polymers, ceramics), and shape memory polymers (SMPs), shape memory ceramics (SMCs), baroplastics, magnetorheological (MR) materials (e.g., fluids and elastomers), electrorheological (ER) materials (e.g., fluids, and elastomers), magnetostrictives, and electrostrictives and composites of the foregoing active materials with non-active materials, systems comprising at least one of the foregoing active materials, and combinations comprising at least one of the foregoing active materials. For convenience and by way of example, reference herein will be made to shape memory alloys and shape memory polymers. The shape memory ceramics, baroplastics, and the like, can be employed in a similar manner. For example, with baroplastic materials, a pressure induced mixing of nanophase domains of high and low glass transition temperature (Tg) components effects the shape change. Baroplastics can he processed at relatively low temperatures repeatedly without degradation. SMCs are similar to SMAs but can tolerate much higher operating temperatures than can other shape-memory materials. An example of an SMC is a piezoelectric material.

The ability of shape memory materials to return to their original shape upon the application or removal of external stimuli has led to their use in actuators to apply force resulting in desired motion. Active material actuators offer the potential for a reduction in actuator size, weight, volume, cost, noise and an increase in robustness in comparison with traditional electromechanical and hydraulic means of actuation. Ferromagnetic SMA's, for example, exhibit rapid dimensional changes of up to several percent in response to (and proportional to the strength of) an applied magnetic field. However, these changes are one-way changes and use the application of either a biasing force or a field reversal to return the ferromagnetic SMA to its starting configuration.

Shape memory alloys are alloy compositions with at least two different temperature-dependent phases or polarity. The most commonly utilized of these phases are the so-called martensite and austenite phases. In the following discussion, the martensite phase generally refers to the more deformable, lower temperature phase whereas the austenite phase generally refers to the more rigid, higher temperature phase. When the shape memory alloy is in the martensite phase and is heated, it begins to change into the austenite phase. The temperature at which this phenomenon starts is often referred to as austenite start temperature (As). The temperature at which this phenomenon is complete is often called the austenite finish temperature (Af). When the shape memory alloy is in the austenite phase and is cooled, it begins to change into the martensite phase, and the temperature at which this phenomenon starts is often referred to as the martensite start temperature (Ms). The temperature at which austenite finishes transforming to martensite is often called the martensite finish temperature (Mf). The range between As and Af is often referred to as the martensite-to-austenite transformation temperature range while that between Ms and Mf is often called the austenite-to-martensite transformation temperature range. It should be noted that the above-mentioned transition temperatures are functions of the stress experienced by the SMA sample. Generally, these temperatures increase with increasing stress. In view of the foregoing properties, deformation of the shape memory alloy is preferably at or below the austenite start temperature (at or below As). Subsequent heating above the austenite start temperature causes the deformed shape memory material sample to begin to revert back to its original (nonstressed) permanent shape until completion at the austenite finish temperature. Thus, a suitable activation input or signal for use with shape memory alloys is a thermal activation signal having a magnitude that is sufficient to cause transformations between the martensite and austenite phases.

The temperature at which the shape memory alloy remembers its high temperature form (i.e., its original, nonstressed shape) when heated can be adjusted by slight changes in the composition of the alloy and through thermo-mechanical processing. In nickel-titanium shape memory alloys, for example, it can be changed from above about 100° C. to below about −100° C. The shape recovery process can occur over a range of just a few degrees or exhibit a more gradual recovery over a wider temperature range. The start or finish of the transformation can be controlled to within several degrees depending on the desired application and alloy composition. The mechanical properties of the shape memory alloy vary greatly over the temperature range spanning their transformation, typically providing shape memory effect and superelastic effect. For example, in the martensite phase a lower elastic modulus than in the austenite phase is observed. Shape memory alloys in the martensite phase can undergo large deformations by realigning the crystal structure arrangement with the applied stress. The material will retain this shape after the stress is removed. In other words, stress induced phase changes in SMA are two-way by nature, application of sufficient stress when an SMA is in its austenitic phase will cause it to change to its lower modulus Martensitic phase. Removal of the applied stress will cause the SMA to switch back to its Austenitic phase, and in so doing, recovering its starting shape and higher modulus.

Exemplary shape memory alloy materials include nickel-titanium based alloys, indium-titanium based alloys, nickel-aluminum based alloys, nickel-gallium based alloys, copper based alloys (e.g., copper-zinc alloys, copper-aluminum alloys, copper-gold, and copper-tin alloys), gold-cadmium based alloys, silver-cadmium based alloys, indium-cadmium based alloys, manganese-copper based alloys, iron-platinum based alloys, iron-palladium based alloys, and so forth. The alloys can be binary, ternary, or any higher order so long as the alloy composition exhibits a shape memory effect, e.g., change in shape, orientation, yield strength, flexural modulus, damping capacity, superelasticity, and/or similar properties. Selection of a suitable shape memory alloy composition depends, in part, on the temperature range of the intended application.

The recovery to the austenite phase at a higher temperature is accompanied by very large (compared to that needed to deform the material) stresses which can be as high as the inherent yield strength of the austenite material, sometimes up to three or more times that of the deformed martensite phase. For applications that require a large number of operating cycles, a strain of less than or equal to 4% or so of the deformed length of wire used can be obtained. In experiments performed with SMA wires of 0.5 millimeter (mm) diameter, the maximum strain in the order of 4% was obtained. This percentage can increase up to 8% for thinner wires or for applications with a low number of cycles. This limit in the obtainable strain places significant constraints in the application of SMA actuators where space is limited.

FSMAs are a sub-class of SMAs. FSMAs can behave like conventional SMAs materials that have a stress or thermally induced phase transformation between martensite and austenite. Additionally FSMAs are ferromagnetic and have strong magnetocrystalline anisotropy, which permit an external magnetic field to influence the orientation/fraction of field aligned martensitic variants. When the magnetic field is removed, the material may exhibit complete two-way, partial two-way or one-way shape memory. For partial or one-way shape memory, an external stimulus, temperature, magnetic field or stress may permit the material to return to its starting state. Perfect two-way shape memory may be used for proportional control with continuous power supplied. One-way shape memory is most useful for latching-type applications where a delayed return stimulus permits a latching function. External magnetic fields are generally produced via soft-magnetic core electromagnets in automotive applications, though a pair of Helmholtz coils may also be used for fast response.

Exemplary ferromagnetic shape memory alloys are nickel-manganese-gallium based alloys, iron-platinum based alloys, iron-palladium based alloys, cobalt-nickel-aluminum based alloys, cobalt-nickel-gallium based alloys. Like SMAs these alloys can be binary, ternary, or any higher order so long as the alloy composition exhibits a shape memory effect, e.g., change in shape, orientation, yield strength, flexural modulus, damping capacity, superelasticity, and/or similar properties. Selection of a suitable shape memory alloy composition depends, in part, on the temperature range and the type of response in the intended application.

As previously mentioned, other exemplary shape memory materials are shape memory polymers (SMPs). "Shape memory polymer" generally refers to a polymeric material, which exhibits a change in a property, such as a modulus, a dimension, a coefficient of thermal expansion, the permeability to moisture, an optical property (e.g., transmissivity), or a combination comprising at least one of the foregoing properties in combination with a change in its a microstructure and/or morphology upon application of an activation signal. Shape memory polymers can be thermoresponsive (i.e., the change in the property is caused by a thermal activation signal delivered either directly via heat supply or removal, or indirectly via a vibration of a frequency that is appropriate to excite high amplitude vibrations at the molecular level which lead to internal generation of heat), photoresponsive (i.e., the change in the property is caused by an electromagnetic radiation activation signal), moisture-responsive (i.e., the change in the property is caused by a liquid activation signal such as humidity, water vapor, or water), chemo-responsive (i.e. responsive to a change in the concentration of one or more chemical species in its environment; e.g., the concentration of H+ ion—the pH of the environment), or a combination comprising at least one of the foregoing.

Generally, SMPs are phase segregated co-polymers comprising at least two different units, which can be described as defining different segments within the SMP, each segment contributing differently to the overall properties of the SMP. As used herein, the term "segment" refers to a block, graft, or sequence of the same or similar monomer or oligomer units, which are copolymerized to form the SNP. Each segment can be (semi-)crystalline or amorphous and will have a corresponding melting point or glass transition temperature (Tg), respectively. The term "thermal transition temperature" is used herein for convenience to generically refer to either a Tg or a melting point depending on whether the segment is an amorphous segment or a crystalline segment. For SMPs comprising (n) segments, the SMP is said to have a hard segment and (n−1) soft segments, wherein the hard segment has a higher thermal transition temperature than any soft segment. Thus, the SMP has (n) thermal transition temperatures. The thermal transition temperature of the hard segment is termed the "last transition temperature", and the lowest thermal transition temperature of the so-called "softest" segment is termed the "first transition temperature". It is important to note that if the SMP has multiple segments characterized by the same thermal transition temperature, which is also the last transition temperature, then the SMP is said to have multiple hard segments.

When the SMP is heated above the last transition temperature, the SMP material can be imparted a permanent shape. A permanent shape for the SMP can be set or memorized by subsequently cooling the SMP below that temperature. As used herein, the terms "original shape", "previously defined shape", "predetermined shape", and "permanent shape" are synonymous and are intended to be used interchangeably. A temporary shape can be set by heating the material to a temperature higher than a thermal transition temperature of any soft segment yet below the last transition temperature, applying an external stress or load to deform the SMP, and then cooling below the particular thermal transition temperature of the soft segment while maintaining the deforming external stress or load.

The permanent shape can be recovered by heating the material, with the stress or load removed, above the particular thermal transition temperature of the soft segment yet below the last transition temperature. Thus, it should be clear that by combining multiple soft segments it is possible to demonstrate multiple temporary shapes and with multiple hard segments it can be possible to demonstrate multiple permanent shapes. Similarly using a layered or composite approach, a combination of multiple SMPs will demonstrate transitions between multiple temporary and permanent shapes.

The shape memory material may also comprise a piezoelectric material. Also, in certain embodiments, the piezoelectric material can be configured as an actuator for providing rapid deployment. As used herein, the term "piezoelectric" is used to describe a material that mechanically deforms (changes shape) when a voltage potential is applied, or conversely, generates an electrical charge when mechanically deformed. Piezoelectrics exhibit a small change in dimensions when subjected to the applied voltage, with the response being proportional to the strength of the applied field and being quite fast (capable of easily reaching the thousand hertz range). Because their dimensional change is small (e.g., less than 0.1%), to dramatically increase the magnitude of dimensional change they are usually used in the form of piezo ceramic unimorph and bi-morph flat patch actuators which are constructed so as to bow into a concave or convex shape upon application of a relatively small voltage. The morphing/bowing of such patches within the liner of the holder is suitable for grasping/releasing the object held.

One type of unimorph is a structure composed of a single piezoelectric element externally bonded to a flexible metal foil or strip, which is stimulated by the piezoelectric element when activated with a changing voltage and results in an axial buckling or deflection as it opposes the movement of the piezoelectric element. The actuator movement for a unimorph can be by contraction or expansion. Unimorphs can exhibit a strain of as high as about 10%, but generally can only sustain low loads relative to the overall dimensions of the unimorph structure.

In contrast to the unimorph piezoelectric device, a bimorph device includes an intermediate flexible metal foil sandwiched between two piezoelectric elements. Bimorphs exhibit more displacement than unimorpbs because under the applied voltage one ceramic element will contract while the other expands. Bimorphs can exhibit strains up to about 20%, but similar to unimorphs, generally cannot sustain high loads relative to the overall dimensions of the unimorph structure.

Exemplary piezoelectric materials include inorganic compounds, organic compounds, and metals. With regard to organic materials, all of the polymeric materials with noncentrosymmetric structure and large dipole moment group(s) on the main chain or on the side-chain, or on both chains within the molecules, can be used as candidates for the piezoelectric film. Examples of polymers include poly(sodium 4-styrenesulfonate) ("PSS"), poly S-119 (Poly(vinylamine) backbone azo chromophore), and their derivatives; polyfluorocarbines, including polyvinylidene fluoride ("PVDF"), its co-polymer vinylidene fluoride ("VDF"), trifluorethylene (TrFE), and their derivatives; polychlorocarbons, including poly(vinylchloride) ("PVC"), polyvinylidene chloride ("PVC2"), and their derivatives; polyacrylonitriles ("PAN"), and their derivatives; polycarboxylic acids, including poly (methacrylic acid ("PMA"), and their derivatives; polyureas, and their derivatives; polyurethanes ("PU"), and their derivatives; bio-polymer molecules such as poly-L-lactic acids and their derivatives, and membrane proteins, as well as phosphate bio-molecules; polyanilines and their derivatives, and all of the derivatives of tetraamines; polyimides, including Kapton® molecules and polyetherimide ("PEI"), and their derivatives; all of the membrane polymers; poly (N-vinyl pyrrolidone) ("PVP") homopolymer, and its derivatives, and random PVP-co-vinyl acetate ("PVAc") copolymers; and all of the aromatic polymers with dipole moment groups in the main-chain or side-chains, or in both the main-chain and the side-chains; as well as combinations comprising at least one of the foregoing.

Further, piezoelectric materials can include Pt, Pd, Ni, T, Cr, Fe, Ag, Au, Cu, and metal alloys comprising at least one of the foregoing, as well as combinations comprising at least one of the foregoing. These piezoelectric materials can also include, for example, metal oxide such as $SiO_2$, $Al_2O_3$, $ZrO_2$, $TiO_2$, $SrTiO_3$, $PbTiO_3$, $BaTiO_3$, $FeO_3$, $Fe_3O_4$, $ZnO$, and combinations comprising at least one of the foregoing; and Group VIA and IIB compounds, such as CdSe, CdS, GaAs, $AgCaSe_2$, ZnSe, GaP, InP, ZnS, and combinations comprising at least one of the foregoing.

Exemplary variable modulus materials also comprise magnetorheological (MR) and ER polymers. MR polymers are suspensions of micrometer-sized, magnetically polarizable particles (e.g., ferromagnetic or paramagnetic particles as described below) in a polymer (e.g., a thermoset elastic polymer or rubber). Exemplary polymer matrices include poly-alpha-olefins, natural rubber, silicone, polybutadiene, polyethylene, polyisoprene, and combinations comprising at least one of the foregoing.

The stiffness and potentially the shape of the polymer structure are attained by changing the shear and compression/tension moduli by varying the strength of the applied magnetic field. The MR polymers typically develop their structure when exposed to a magnetic field in as little as a few milliseconds, with the stiffness and shape changes being proportional to the strength of the applied field. Discontinuing the exposure of the MR polymers to the magnetic field reverses the process and the elastomer returns to its lower modulus state. Packaging of the field generating coils, however, creates challenges.

Electronic electroactive polymers (EAPs) are a laminate of a pair of electrodes with an intermediate layer of low elastic modulus dielectric material. Applying a potential between the electrodes squeezes the intermediate layer causing it to expand in plane. They exhibit a response proportional to the applied field and can be actuated at high frequencies. EAP morphing laminate sheets have been demonstrated. Their major downside is that they require applied voltages approximately three orders of magnitude greater than those required by piezoelectrics.

Electroactive polymers include those polymeric materials that exhibit piezoelectric, pyroelectric, or electrostrictive properties in response to electrical or mechanical fields. An example of an electrostrictive-grafted elastomer with a piezoelectric poly(vinylidene fluoride-trifluoro-ethylene) copolymer. This combination has the ability to produce a varied amount of ferroelectric-electrostrictive molecular composite systems.

Materials suitable for use as an electroactive polymer may include any substantially insulating polymer and/or rubber that deforms in response to an electrostatic force or whose deformation results in a change in electric field. Exemplary materials suitable for use as a pre-strained polymer include silicone elastomers, acrylic elastomers, polyurethanes, thermoplastic elastomers, copolymers comprising PVDF, pressure-sensitive adhesives, fluoroelastomers, polymers comprising silicone and acrylic moieties (e.g., copolymers comprising silicone and acrylic moieties, polymer blends comprising a silicone elastomer and an acrylic elastomer, and so forth).

Materials used as an electroactive polymer can be selected based on material propert(ies) such as a high electrical breakdown strength, a low modulus of elasticity (e.g., for large or small deformations), a high dielectric constant, and so forth.

In one embodiment, the polymer can be selected such that is has an elastic modulus of less than or equal to about 100 MPa. In another embodiment, the polymer can be selected such that is has a maximum actuation pressure of about 0.05 megaPascals (MPa) and about 10 MPa, or, more specifically, about 0.3 MPa to about 3 MPa. In another embodiment, the polymer can be selected such that is has a dielectric constant of about 2 and about 20, or, more specifically, about 2.5 and about 12. The present disclosure is not intended to be limited to these ranges. Ideally, materials with a higher dielectric constant than the ranges given above would be desirable if the materials had both a high dielectric constant and a high dielectric strength. In many cases, electroactive polymers can be fabricated and implemented as thin films, e.g., having a thickness of less than or equal to about 50 micrometers.

As electroactive polymers may deflect at high strains, electrodes attached to the polymers should also deflect without compromising mechanical or electrical performance. Generally, electrodes suitable for use can be of any shape and material provided that they are able to supply a suitable voltage to, or receive a suitable voltage from, an electroactive polymer. The voltage can be either constant or varying over time. In one embodiment, the electrodes adhere to a surface of the polymer. Electrodes adhering to the polymer can be compliant and conform to the changing shape of the polymer. The electrodes can be only applied to a portion of an electroactive polymer and define an active area according to their geometry. Various types of electrodes include structured electrodes comprising metal traces and charge distribution layers, textured electrodes comprising varying out of plane dimensions, conductive greases (such as carbon greases and silver greases), colloidal suspensions, high aspect ratio conductive materials (such as carbon fibrils and carbon nanotubes, and mixtures of ionically conductive materials), as well as combinations comprising at least one of the foregoing.

Exemplary electrode materials can include graphite, carbon black, colloidal suspensions, metals (including silver and gold), filled gels and polymers (e.g., silver filled and carbon filled gels and polymers), and ionically or electronically conductive polymers, as well as combinations comprising at least one of the foregoing. It is understood that certain electrode materials may work well with particular polymers and may not work as well for others. By way of example, carbon fibrils work well with acrylic elastomer polymers while not as well with silicone polymers.

Magnetostrictives are solids that develop a large mechanical deformation when subjected to an external magnetic field. This magnetostriction phenomenon is attributed to the rotations of small magnetic domains in the materials, which are randomly oriented when the material is not exposed to a magnetic field. The shape change is largest in ferromagnetic or ferromagnetic solids. These materials possess a very fast response capability, with the strain proportional to the strength of the applied magnetic field, and they return to their starting dimension upon removal of the field. However, these materials have maximum strains of about 0.1 to about 0.2 percent.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A device for selectively controlling and varying a frictional force level at an interface between two bodies, comprising:
    a first contact body having at least one surface presenting an adjustable condition morphology defining a flat configuration;
    a second contact body having at least one surface in physical communication with the first contact body; and
    an active material in operative communication with and composing a selected one or both of the first contact body and the second contact body, so as to at least partially define at least one of said at least one surfaces, wherein the active material is configured to undergo a change in a property upon receipt of an activation signal, wherein the change in a property is configured to modify the morphology so as to create a plurality of anisotropic wrinkles, and the frictional force level at the interface between the at least one surface of the first contact body and the at least one surface of the second contact body, as a result of modifying the morphology.

2. The device of claim 1, wherein the active material comprises a shape memory polymer, a ferromagnetic shape memory alloy, an electroactive polymer, a piezoelectric material, a magnetorheological elastomer, an electrorheological elastomer, an electrostrictive material, a magnetostrictive material, or a combination comprising at least one of the foregoing active materials.

3. The device of claim 1, wherein the change in the property further produces a dimensional change, a shape change, an orientation change, a phase change, a flexural modulus change, an elastic modulus change, or combinations comprising at least one of the foregoing.

4. The device of claim 1, wherein the activation signal comprises a thermal activation signal, an electric activation signal, a magnetic activation signal, a chemical activation signal, a mechanical load, or a combination comprising at least one of the foregoing activation signals.

5. The device of claim 1, further comprising an activation device configured to provide the activation signal to the active material.

6. The device of claim 1, wherein the change is further configured to increase or decrease a fluid flow communicatively coupled to the interface, and modify the frictional force level at the interface between the two bodies, as a result thereof.

7. The device of claim 1, wherein the change in the frictional force level at the interface between the two bodies is effective to increase traction between the first surface and the second surface.

8. The device of claim 1, wherein the change in the frictional force level at the interface between the two bodies is configured to selectively engage and disengage a control knob.

9. A method for controlling a frictional force level at an interface between a first contact body and a second contact body, the method comprising:
    contacting a first contact surface of the first contact body and a second contact surface of the second contact body to generate a frictional force level between the first contact surface and the second contact surface, the first contact surface presenting an adjustable condition morphology defining a flat configuration, and the second contact surface being in physical communication with the first contact surface; and
    applying an activation signal to an active material in operative communication with and composing a selected one or both of the first contact body and the second contact body, so as to at least partially define at least one of said first and second contact surfaces, and causing a change in a property of the active material, wherein the change in the property is effective to modify the morphology so as to create a plurality of anisotropic wrinkles, and the frictional force level at the interface between the first contact surface of the first contact body and the second contact surface of the second contact body, as a result of modifying the morphology.

10. The method of claim 9, wherein the active material comprises a shape memory polymer, an electroactive polymer, a magnetorheological elastomer, an electrorheological elastomer, an electrostrictive material, a magnetostrictive material, or a combination comprising at least one of the foregoing active materials.

11. The method of claim 9, wherein the change in the property comprises a dimensional change, a shape change, an orientation change, a phase change, a flexural modulus change, an elastic modulus change, or combinations comprising at least one of the foregoing properties.

12. The method of claim 9, wherein the activation signal comprises a thermal activation signal, an electric activation signal, a magnetic activation signal, a chemical activation signal, a mechanical load, or a combination comprising at least one of the foregoing activation signals.

* * * * *